(12) United States Patent
Ayyildiz et al.

(10) Patent No.: US 9,252,767 B1
(45) Date of Patent: Feb. 2, 2016

(54) INTEGRATED SWITCH MODULE

(75) Inventors: Kasim Ayyildiz, Nashua, NH (US);
Michael Clark, Lunenburg, MA (US);
Peter Katzin, Arlington, MA (US)

(73) Assignee: HITTITE MICROWAVE CORPORATION, Chelmsford, MA (US)

(*) Notice: Subject to any disclaimer, the term of this patent is extended or adjusted under 35 U.S.C. 154(b) by 930 days.

(21) Appl. No.: 13/135,194

(22) Filed: Jun. 28, 2011

Related U.S. Application Data

(60) Provisional application No. 61/398,593, filed on Jun. 28, 2010.

(51) Int. Cl.
*G05F 1/10* (2006.01)
*H03K 17/693* (2006.01)

(52) U.S. Cl.
CPC .................................... *H03K 17/693* (2013.01)

(58) Field of Classification Search
CPC ....................................................... H03K 17/693
USPC ............................................................ 307/98
See application file for complete search history.

(56) References Cited

U.S. PATENT DOCUMENTS

| | | | | |
|---|---|---|---|---|
| 6,489,680 B2* | 12/2002 | Kohjiro et al. | | 257/728 |
| 6,998,709 B2* | 2/2006 | Khorram | | 257/728 |
| 7,026,664 B2* | 4/2006 | Divakar et al. | | 257/107 |
| 7,719,141 B2* | 5/2010 | McMorrow | | 307/115 |
| 7,863,979 B2* | 1/2011 | Chung et al. | | 330/124 R |
| 2004/0005871 A1* | 1/2004 | Saito et al. | | 455/287 |
| 2007/0128821 A1* | 6/2007 | Lee et al. | | 438/381 |
| 2008/0111219 A1* | 5/2008 | Harnden et al. | | 257/676 |
| 2008/0315356 A1* | 12/2008 | Reisner | | 257/531 |
| 2009/0159900 A1* | 6/2009 | Basoor et al. | | 257/82 |
| 2009/0251119 A1* | 10/2009 | Stojcic et al. | | 323/282 |
| 2010/0194468 A1* | 8/2010 | Kumamaru | | 327/535 |
| 2011/0062584 A1* | 3/2011 | Ishihara | | 257/737 |

FOREIGN PATENT DOCUMENTS

WO    WO 2009/136496 A1 * 11/2009

* cited by examiner

*Primary Examiner* — Jared Fureman
*Assistant Examiner* — Duc M Pham
(74) *Attorney, Agent, or Firm* — Knobbe, Martens, Olson & Bear LLP

(57) ABSTRACT

An integrated RF switch module including a package customized to include at least one trace. The trace includes one or more of at least one connection pad and at least one landing pad. At least one switching die is connected to the at least one connection pad. At least one device is connected to the at least one landing pad, the at least one device configured to enhance the performance of the switching die.

49 Claims, 15 Drawing Sheets

INTEGRATED SWITCH MODULE

RELATED APPLICATIONS

This application hereby claims the benefit of and priority to U.S. Provisional Application Ser. No. 61/398,593, filed on Jun. 28, 2010 under 35 U.S.C. §§119, 120, 363, 365, and 37 C.F.R. §1.55 and §1.78, which application is incorporated herein by reference.

FIELD OF THE INVENTION

The subject invention relates to an integrated switch module.

BACKGROUND OF THE INVENTION

An RF switch is a building block that is commonly used in radio frequency (RF)/microwave systems. An RF switch typically has two states: a low loss state (the "through state") and a high loss state (the "isolation state"). Hence, an RF switch may be used to make a low loss path between two nodes in an RF/microwave system or it may be used to isolate the two nodes. A control signal in the form of a DC voltage or a DC current is typically used to toggle between the low loss state and the isolation state of a switch. Semiconductor devices, such as voltage controllable FET devices on CMOS, MESFET or HEMT, and the like, are commonly used as switching elements for the RF switch. RF switches which utilize such devices are often limited in terms of the achievable performance. Additional components or devices, such as capacitors, inductors, and the like, are often used to enhance RF performance or increase the operating frequency of the switch. Such performance enhancing components may be integrated inside the RF switch IC or may be located external to the RF switch IC. Externally located performance enhancing devices offer low loss and better reliability when compared to components integrated in the RF switch IC. However, external components are not desired by the system designers because additional board space is required for the external components and it is difficult, if not impossible, to confirm the performance of the switch with external components assembled in the system. Also, using external components may increase the unwanted parasitic inductance and capacitance and this in turn may limit the maximum frequency and/or bandwidth over which the overall switch module can operate with good performance.

BRIEF SUMMARY OF THE INVENTION

This invention features an integrated RF switch module including a package customized to include at least one trace. The at least one trace includes one or more of at least one connection pad and at least one landing pad. At least one switching die is connected to the at least one connection pad. At least one device is connected to the at least one landing pad, the at least one device configured to enhance the performance of the switching die.

In one embodiment, the integrated switch module may include a plurality of traces each including one or more connection pads and one or more landing pads. The at least one device may be connected between two landing pads. The at least one device may include an inductor. The at least one device may include a capacitor. The at least one device may include a resistor. The at least one device may include a low noise amplifier. The at least one device may include an additional switching die. The at least one device may include a bias control circuit. The switching die may include a switching semiconductor die. The switching die may include a high power semiconductor single pole-double-throw switching die. The switching die may include a semiconductor die with a predetermined number of poles and a predetermined number of throws. The switching die may include a high power semiconductor single pole-four-throw switching die. The at least one switching die may include a plurality of switching dies. The switching die may include one or more FET switches. The one or more FET switches may be connected in series. The integrated switch module may include one or more traces configured to reduce the length of bond wires connecting to the switching die. The integrated switch module may include one or more capacitors and/or one or more inductors that are configured to tune the frequency response of the switch module. The at least one trace, the at least one landing pad, the at least one connection pad, the at least one switching die, and the at least one device may be formed on the package. The package may include a lead frame package. The lead frame package may be a quad flat no leads (QFN) package. The at least one device may include a plurality of devices. The plurality of devices may include one or more of: a capacitor, an inductor and/or a resistor. The at least one device may be configured to enhance the performance by increasing the operating frequency of the switching die to enable high-power low insertion loss over a narrow bandwidth. The at least one device may be configured to enhance the performance by providing a fail-safe operation of the switching die. The at least one switching die may include a bias control circuit. The at least one switching die may be connected to the at least one trace in a flipped-chip configuration.

This invention also features an integrated switch module including a package customized to include: at least one trace, the trace including one or more of at least one connection pad and at least one landing pad, at least one switching die connected to the at least one connection pad, and at least one device connected to the at least one landing pad, the one device configured to enhance the performance of the switching die.

This invention also features an integrated switch module including a package customized to include: at least one switching die, at least one connection trace including at least one connection pad configured to connect to the switching die, an at least one device trace is configured to form at least one device, the at least one device configured to enhance the performance of the at least one switching die.

In another embodiment, the at least one device may include an inductor. The at least one device may include a capacitor. The at least one device may include a resistor. The at least one device may include a low noise amplifier. The at least one device may include an additional switching die. The at least one device may include a bias control circuit. The switching die may include a switching semiconductor die. The switching die may include a semiconductor switching die with a predetermined number of poles and a predetermined number of throws. The switching die may include a high power semiconductor single pole-double-throw switching die. The switching die may include a high power semiconductor single pole-four-throw switching die. The at least one switching die may include a plurality of switching dies. The integrated switch module may include one or more connection traces configured to reduce the length of bond wires connecting to the switching die. The at least one device trace may include a plurality of device traces configured to form a plurality of devices configured to enhance the performance of the at least one switching die. The package may include a lead frame package. The lead frame package may be a quad flat no leads (QFN) package. The lead frame package may also be a dual flat no leads (DFN) package. The integrated switch module may include one or more capacitors and/or one or more inductors that are configured to tune the frequency response of the switch module. The at least one device may be configured to enhance the performance by increasing the operating frequency of the switching die to enable high-power low insertion loss over a narrow bandwidth. The at least one device may be configured to enhance said performance by providing a fail-safe operation of said switching die. The at least one switching die may include a bias control circuit.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
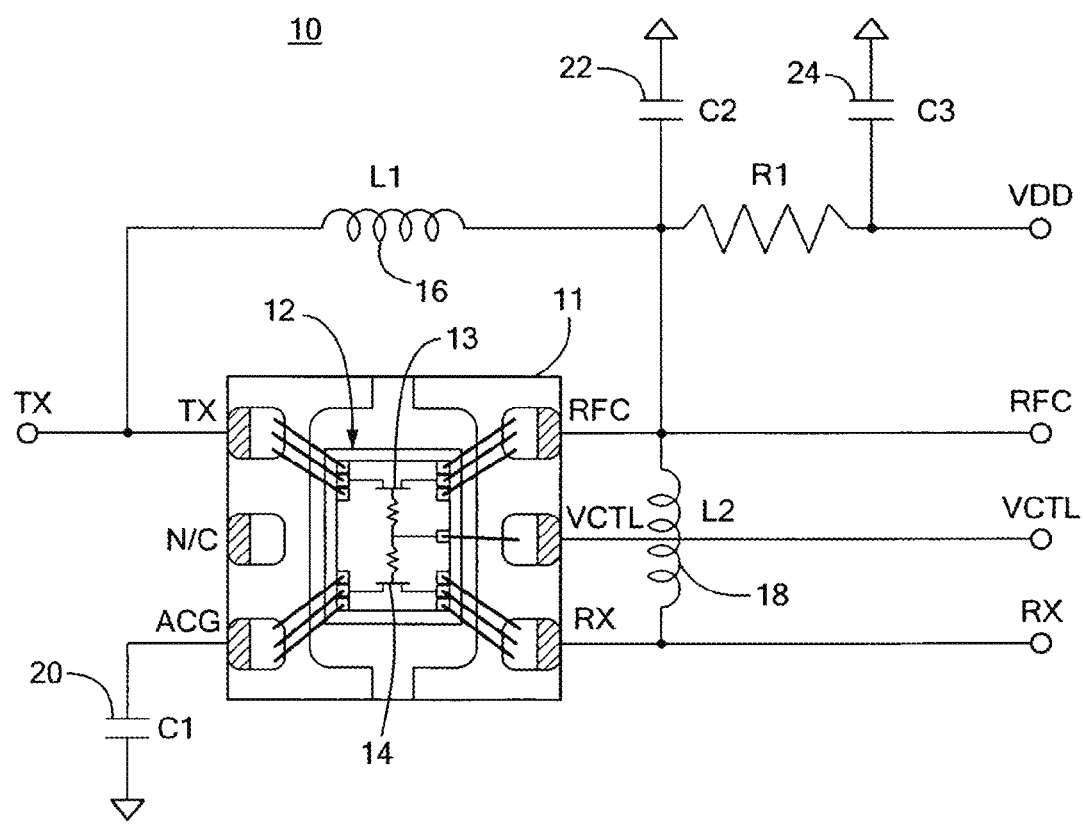
FIG. 1 is schematic diagram of a conventional RF switching circuit employing devices which enhance the performance of the RF switch Integrated Circuit (IC); these devices are located external to the IC package.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
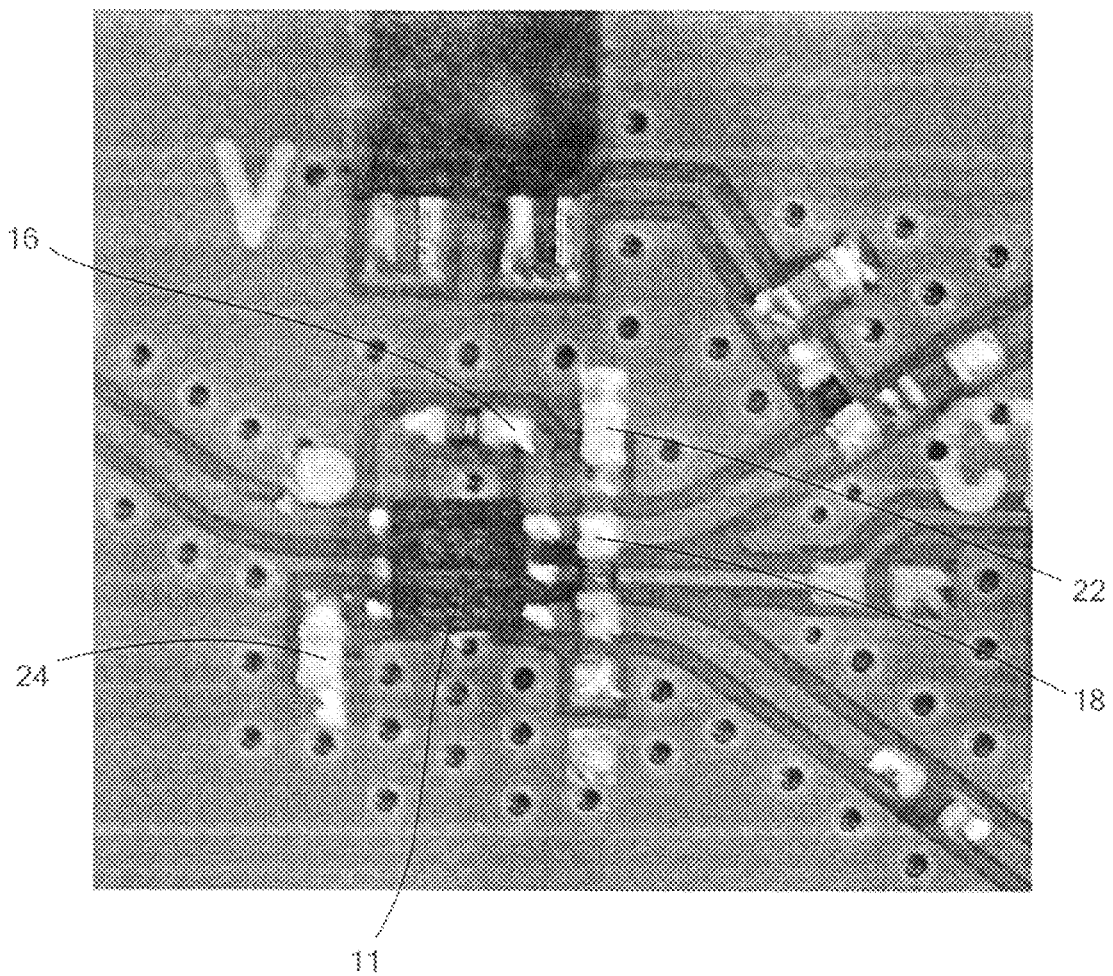
FIG. 2 is a photograph of the board layout for the RF switching module shown in FIG. 1.

FIG. 1 shows an example of a narrow-bandwidth single-pole-double-throw (SPDT) RF switch circuit 10 with switching Integrated Circuit (IC) 11, e.g., including packaged semiconductor switching die 12 such as in part no. HMC646LP2, available from Hittite Corporation (Chelmsford, Mass.). In this example, the switching performance of the overall switch is achieved utilizing pHEMT FET devices 13 and 14 as switching elements for switching die 12 and external inductors 16, 18 and capacitors 20, 22, and 24 for frequency response enhancement of switching die 12. This narrow-bandwidth SPDT switch configuration can be used to implement a tuned switch with an operating bandwidth typically up to 20% of its RF center-frequency and with asymmetric RF power handling capability. The FIG. 1 configuration may allow low-loss transmission of high power RF signals between the RFC and TX ports and isolation between the RFC and RX ports when both switching FET devices are turned ON. Good RF operation may be maintained over a relatively narrow bandwidth around the frequency of resonance of inductor 18 and capacitor 22, and parasitic capacitance associated with interconnections and other devices connected to the RFC node in particular, and the frequency of resonance of capacitor 20 and any parasitic inductances inherent in the interconnections with the switching die 12 at ports RX and ACG. If the switching FET devices used are depletion-mode FETs, then the same low-loss transmission between RFC and TX port and isolation between the RFC and RX ports can be achieve with zero DC bias on both VDD and VCTRL pins, thereby providing "fail-safe" operation for the switch if these bias signals are lost. This fail-safe mode, together with very high-power handling with low loss and low distortion with low or zero to moderate DC bias voltage levels are the primary benefits of this narrow bandwidth switch configuration. If both switching FET devices 13, 14 are turned off using moderate DC bias voltage on the VDD pin with zero-bias on the VCTRL pin, the FIG. 1 embodiment may provide low-loss transmission of RF signals between the RFC and RX ports and isolation between the RFC and TX ports. Good isolation between the RFC and TX ports may be obtained over a narrow bandwidth around the resonance frequency between inductor 16, the parasitic capacitance of switching FET 13, and any other parasitic inductance and capacitance associated with these devices or interconnections thereto. Low-loss transmission between the RFC and RX ports may be obtained over a narrow bandwidth around the frequency where good isolation between the RFC and TX ports is achieved and where inductor 18, capacitor 22, the parasitic capacitance associated with the switching FET 14, and any parasitic capacitance associated with the interconnects at ports RFC and RX form a 50Ω transmission line. With moderate DC bias voltage on the VDD pin, only moderate RF power levels can be handled between the RFC and RX ports with low distortion, but this may be perfectly adequate in many applications, such as RF transceivers, where there is a large disparity in the signal power levels that need to be handled in these two switch states. One example of the board layout for switching circuit 10 with switching IC 11, externally located inductors 16, 18, and externally located capacitors 20, 22 and 24 is shown in FIG. 2. As discussed in the Background section above, external inductors 16, 18 and capacitors 20-24 require additional board space and the performance of switch circuit 10 is difficult to control. Using external inductors 16, 18 and capacitors 20-24 also increases the unwanted parasitic inductance and this, in turn, may limit the maximum frequency at which integrated switch module 10 can operate with good performance.

Figure 3:
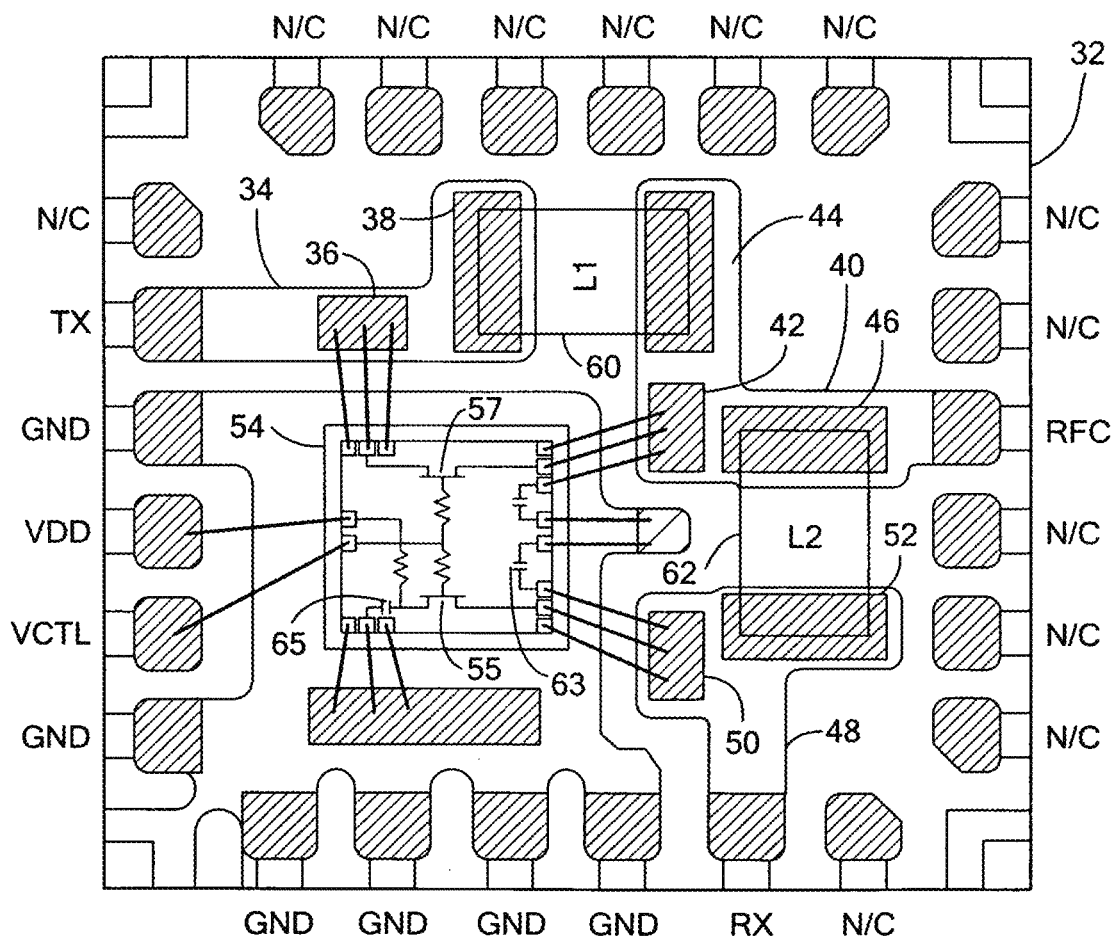
FIG. 3 is a package assembly diagram of one embodiment of the integrated switch module of this invention.
Figure 4:
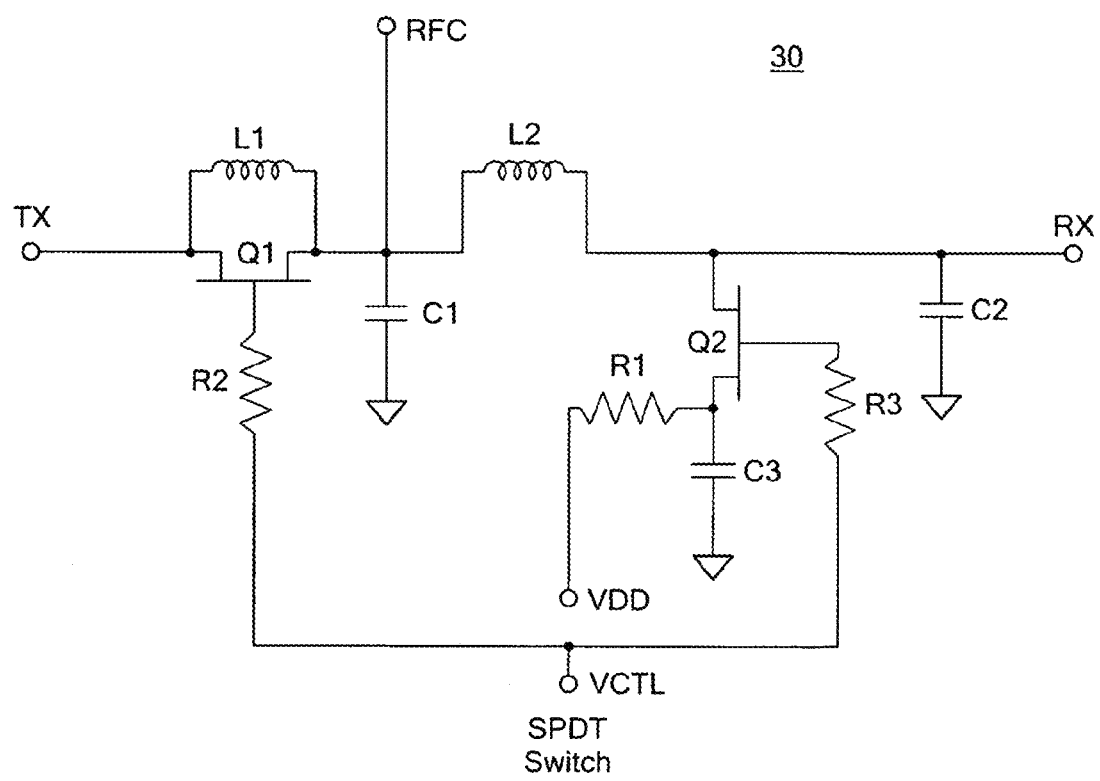
FIG. 4 is a schematic circuit diagram of one embodiment of the integrated switch module shown in FIGS. 3, 11, and 13A.

Integrated switch module 30, FIG. 3, of one embodiment of this invention, includes package 32 which is customized to include trace 34 with connection pad 36, landing pad 38 and input pin TX. Package 32 also preferably includes trace 40 with connection pad 42, landing pads 44 and 46 and input pin RFC and trace 48 with connection pad 50, landing pad 52 and input pin RX. A trace may also be customized to provide attachment area for the switching die 54 and to provide landing pads for grounding bond wires. Integrated switch module 30 includes switching die 54 which is connected to connection pads 36, 42, and 50 on traces 34, 40, 48, respectively. In this example, switching die 54 may include high power semiconductor switch devices, e.g., a single pole-double throw (SPDT) switching die, similar to the die in part no. HMC646LP2, by Hittite Microwave Corporation (Chelmsford, Mass.), a single pole-four-pole throw switching die, or a switching die with a predetermined number of poles and a predetermined number of throws. FIG. 4 shows a schematic circuit diagram of one embodiment integrated switch module 30 configured as an SPDT switch with capacitors C1, C2, C3, inductors L1 and L2, resistors R1, R2, and R3 and switches Q1 and Q1.

Integrated switch module 30, FIG. 3, also includes at least one device connected to at least one landing pad. The at least one device is preferably configured to enhance the performance of switching die 54. In this example, inductor 60 (L1) is connected between landing pads 38 and 44 and inductor 62 (L2) is connected between landing pads 46 and 52.

Thus, integrated switch module 30 integrates switching die 54 and external performance enhancing devices, e.g., inductors, 60, 62, and/or capacitors or similar performance enhancing devices (discussed below) in package 32. In one example, package 32 may be a plastic-molded Quad Flat No leads (QFN) surface-mount 4×4 mm² package with a customized lead-frame as shown in FIG. 3. The lead frame package may also be a dual flat no leads (DFN) package. Field effect transistor (FET) devices 55 and 57 may be used for the switching elements of switching die 54 and capacitors 61, 63 and 65 may be integrated in the switching die 54. Preferably, inductors 60 and 62 are commercially available surface-mount components and are embedded in the custom etched lead-frame of package 32, as discussed above. The switching elements for switching die 54 may be single FET devices or they may be multiple FET devices connected in series (stacked) for improved power handling capability of switching die 54. Preferably, switching die 54 and the additional performance enhancing devices are optimally placed relative to each other to improve the performance of integrated switch module 30. Preferably, integrated switch module 30 matches all three radio frequency (RF) ports (RFC, RX and TX) to the desired system impedance.

The result is the integrated switch module of one or more embodiments of this invention provides for integrating the switching die and additional devices which enhance the performance of the switching die in a customized package to provide optimum performance. By integrating the switching die and the performance enhancing devices inside the customized package, the performance of the integrated switch module switch can be tested before it is shipped to the customer and preferably meets the required specifications. The integrated switch module of one or more embodiments of this invention can use better performing off-chip devices, such as inductors, capacitors, and the like. The integrated switch module requires less board space when compared to a conventional switch module wherein the switching component and the additional components are laid out separately on the PCB board. The integrated switch module preferably simplifies the PCB board design, increases yield, and reduces or eliminates the troubleshooting time arising from unexpected performance degradation due to less than optimum placement of the switching die and the additional performance enhancing components relative to each other. The integrated switch module may also provide the ability to tune for different frequencies of operation by varying only the value of the external components that are readily available in numerous values from numerous suppliers. Hence, tuning to a different frequency in production may be significantly easier when compared to conventional switch modules where the required components are either integrated on the same die with the switching element or where components of specific values are printed on the laminate PCB.

Figure 5:
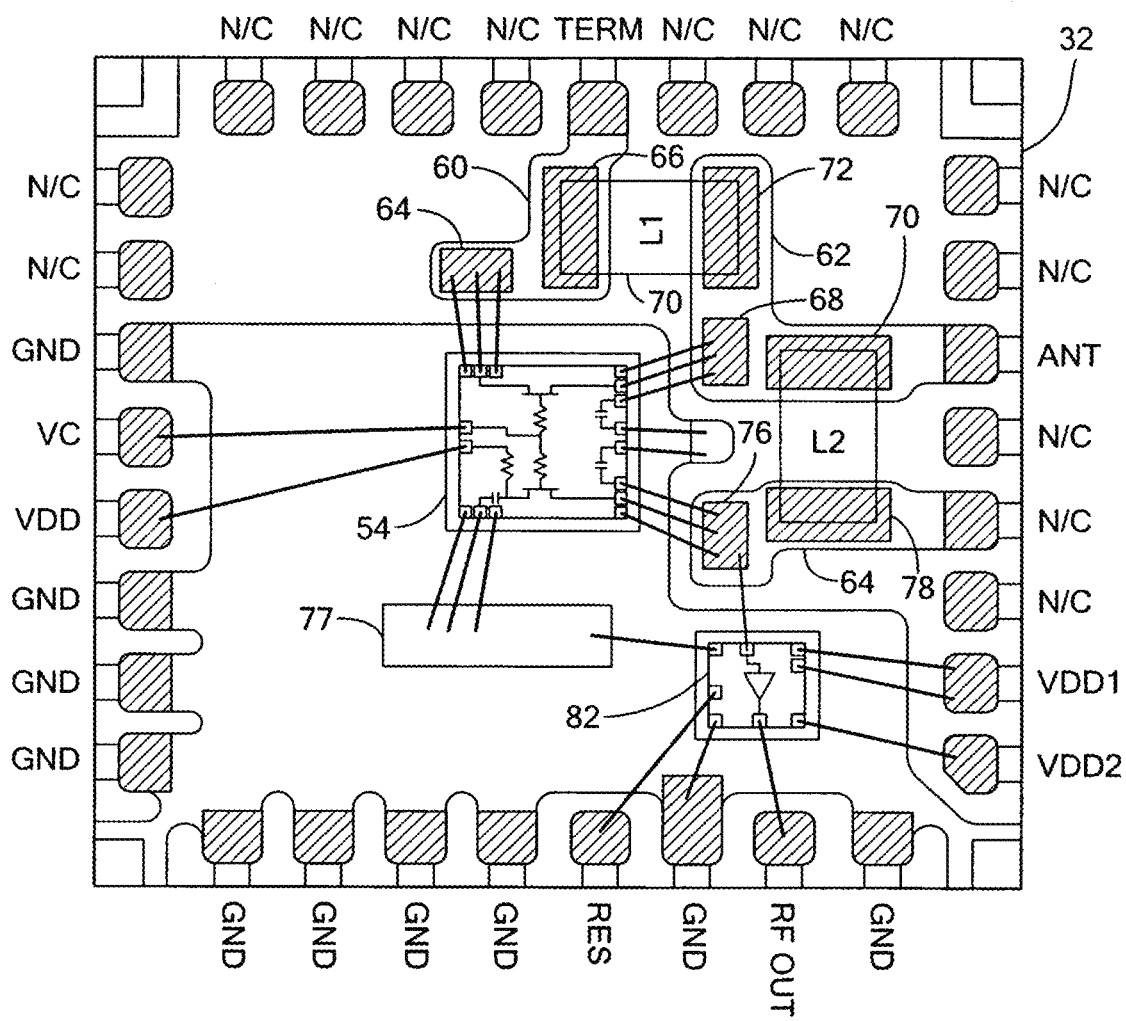
FIG. 5 is a package assembly diagram of another embodiment of the integrated switch module of this invention including a low noise amplifier (LNA)

Integrated switch module 30a, FIG. 5, where like parts include like numbers includes customized package 32 which, includes traces 60, 62 and 64 as well as a trace to provide attachment area for the switching die 54, LNA die 82 and to provide landing pads for grounding bond wires. Trace 60 includes connection pad 64, landing pad 66 and input pin TERM. Trace 62 includes connection pad 68, landing pads 70 and 72 and input pin ANT. Trace 64 includes connection pad 76 and landing pad 78.

Figure 6:
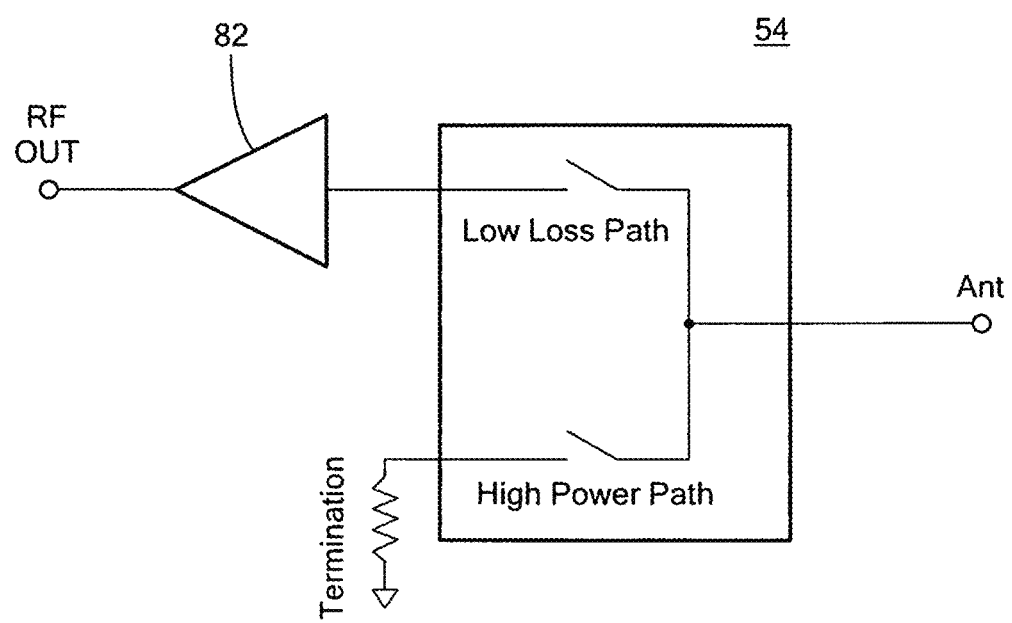
FIG. 6 is a schematic block diagram of one embodiment of the integrated switch module including an LNA shown in FIG. 5.

Integrated switch module 30a includes switching die 54 which is connected to connection pads 64, 68, and 76 on traces 60, 62, and 64, respectively and connection pad 77. In this example, switching die 54 may be an SPDT switching die having the same structure as discussed above with reference to FIGS. 3-4 or any similar type switching die known to those skilled in the art. Inductor 78 (L1) is connected between landing pad 66 and 72. Inductor 80 (L2) is connected between landing pads 70 and 78. Integrated switch module 30a preferably includes low noise amplifier (LNA) die 82. FIG. 6 shows a schematic block diagram of the module 30a. The termination resistor shown in FIG. 6 may be implemented externally to the module.

In this example, LNA 82 is preferably connected to connection pad 76 on trace 64 and connection pad 77. Thus, integrated switch module 30a integrates switching die 54, LNA die 82, and inductors 78 and 80 in package 32. Package 32 is preferably a custom lead-frame 5×5 mm plastic QFN package. Similar as discussed above with reference to FIG. 3, FET devices can be used as the switching elements of switching die 54, single FET devices may be used, or stacked FET devices may be used to improve the power handling capability of switching die 54. Integrated switch module 30a preferably makes a connection to LNA die 82 for received signals in the receive mode of switching module 30a and prevents unwanted high power transmitted signals from reaching to LNA 82 in the protect mode of switching die 54. Preferably, integrated switching module 30a matches all three radio frequency (RF) ports (ANT, TERM, and RF OUT) to the desired system impedance.

Figure 7:
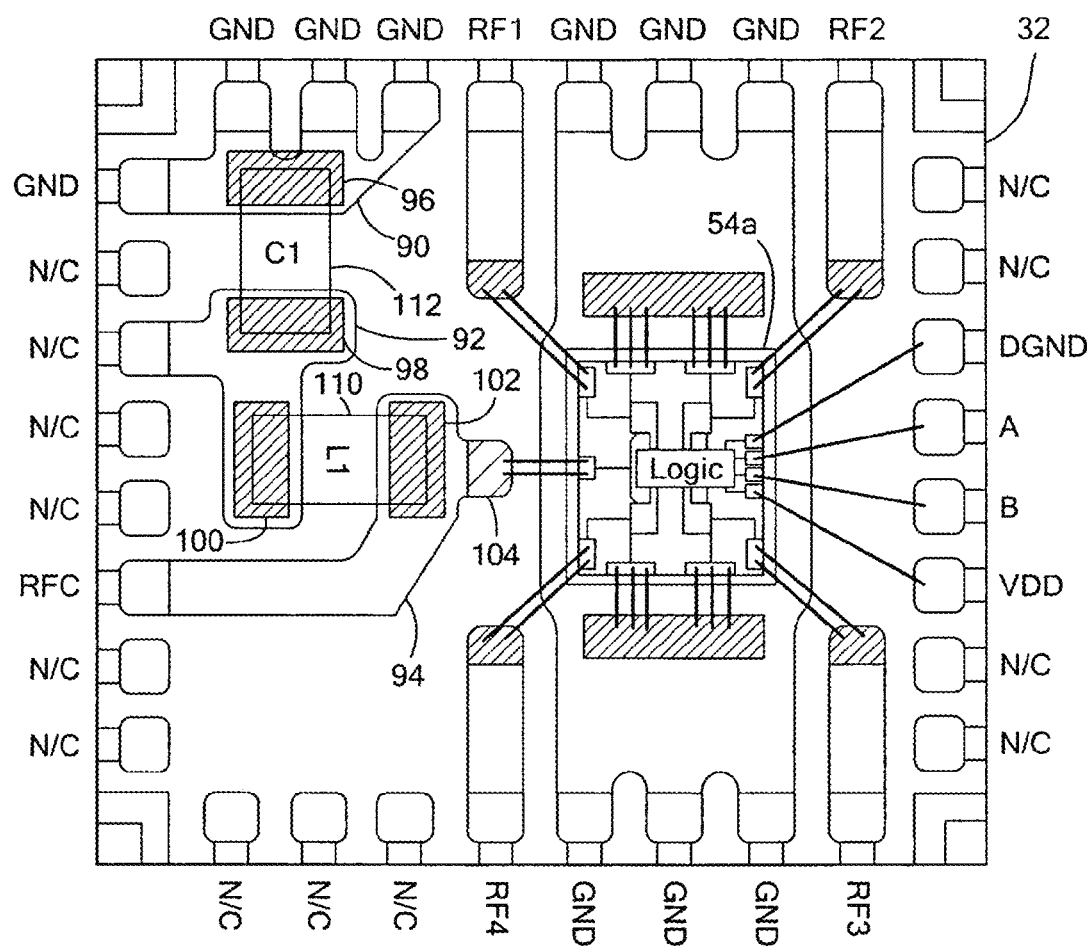
FIG. 7 is a package assembly diagram of another embodiment of the integrated switch module of this invention.
Figure 8:
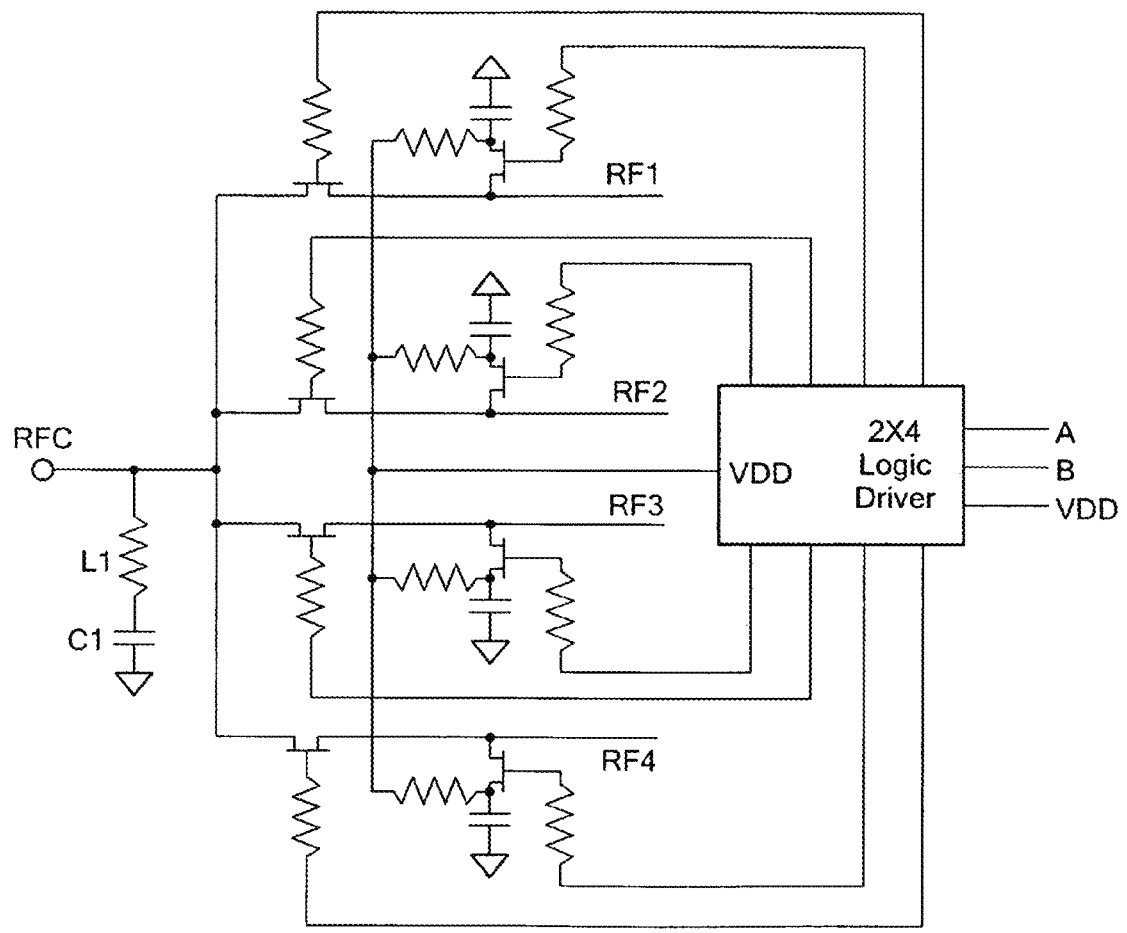
FIG. 8 is a schematic circuit diagram of one embodiment of the integrated switch module shown in FIG. 7.

Integrated switch module 30b, FIG. 7, where like parts have been given like numbers, of another embodiment of this invention, includes package 32 with traces 90, 92 and 94 as well as a trace which may also customized to provide attachment area for the switching die 54a and to provide landing pads for grounding bond wires. Trace 90 includes landing pad 96, trace 92 includes landing pads 98 and 100, and trace 94 includes landing pad 102, connection pad 104, and input pin RFC. Integrated switch module 30b also includes additional traces with connection pads as shown for RF1, RF2, RF3, and RF4 which are also customized. In this example, inductor 110 (L1) is connected between landing pads 100 and 102. Capacitor 112 (C1) is connected between landing pads 96 and 98. Integrated switch module 30b includes switching die 54a, which is connected to connection pad 104 on trace 94 and the connection pads on the traces for RF1, RF2, RF3, and RF4. In one example, switching die 54a may be a semiconductor single-pole-four-throw (SP4T) switching die, e.g., as shown in FIG. 8. Package 32 is preferably a custom lead-frame 5×5 mm plastic QFN package. Inductor 110 is preferably used to resonate out the parasitic capacitance at the common port of switch 54a. Capacitor 112 is preferably used for DC voltage blocking. Thus, inductor 110 and capacitor 112 help to significantly increase the RF operating frequency of integrated switch module 30b. FET devices can be used as the switching elements for switching die 54a, single FET can be used, or stacked FETs may be used to improve power handling capability of the switch 54a. Preferably integrated switch module 30b matches all five radio frequency (RF) ports (RF1, RF2, RF3, RF4 and RFC) to the desired system impedance.

Figure 9:
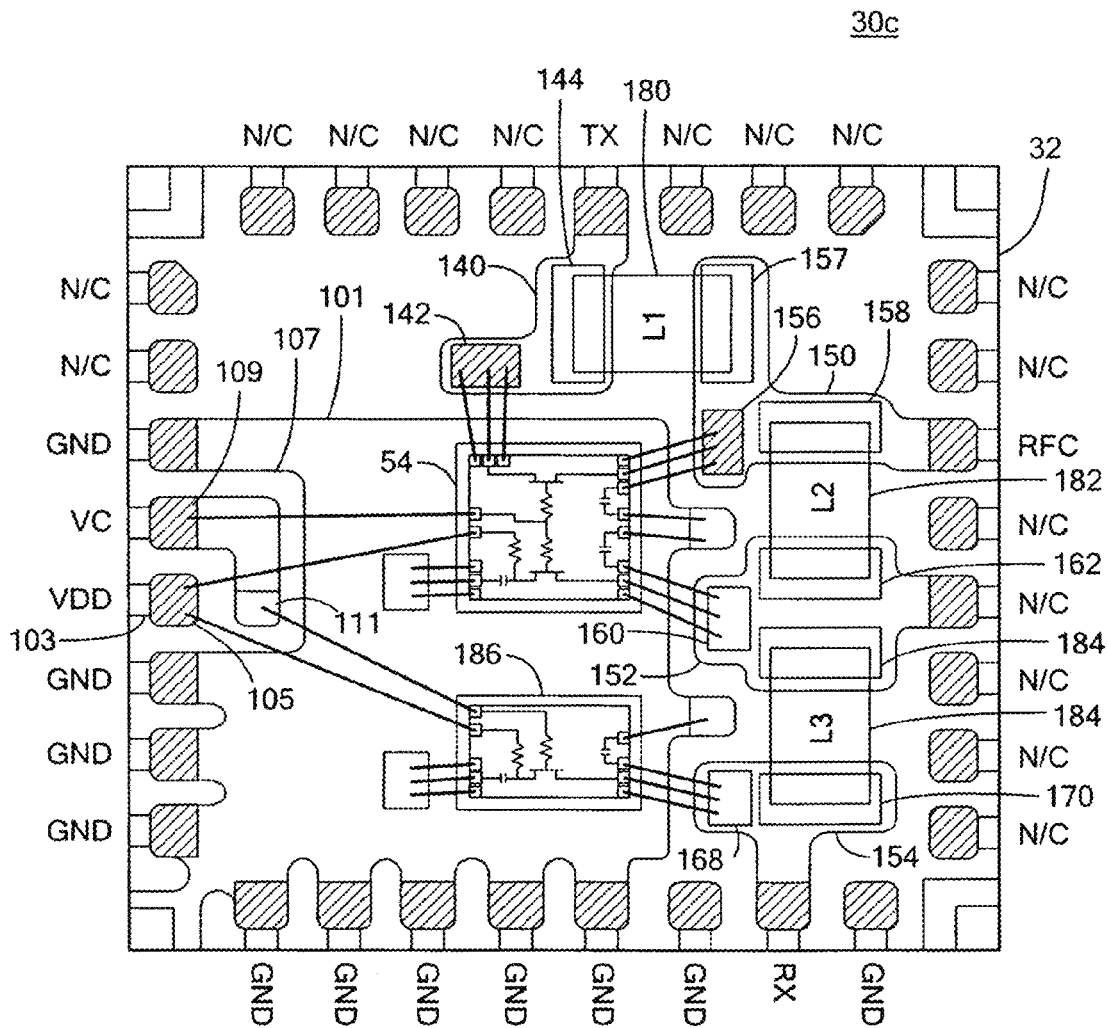
FIG. 9 is a package assembly diagram of another embodiment of the integrated switch module of this invention wherein two switching dies are used.

Integrated switch module 30c, FIG. 9, where like parts have been given like numbers, includes package 32 which is customized to include traces 140, 150, 152 and 154 as well as trace 101 which may also be customized to provide attachment area for the switching dies 54 and 186 and to provide landing pads for grounding bond wires. In this example, trace 140 includes connection pad 142, landing pad 144 and input pin TX. Trace 150 includes connection pad 156, landing pads 157, 158 and input pin RFC. Trace 152 includes connection pad 160 and landing pads 162 and 164. Trace 154 includes connection pad 168, landing pad 170 and input pin RX. Package 32 also includes trace 103 with connection pad 105 and input pin VDD and trace 107 with connection pads 109 and 111 and input pin VC, which are preferably customized. Integrated switch module 30 also includes inductor 180 (L1) which is connected between landing pads 144 and 157. Inductor 182 (L2) is connected between landing pads 158 and 162. Inductor 184 (L3) is connected between landing pads 164 and 170.

Figure 10:
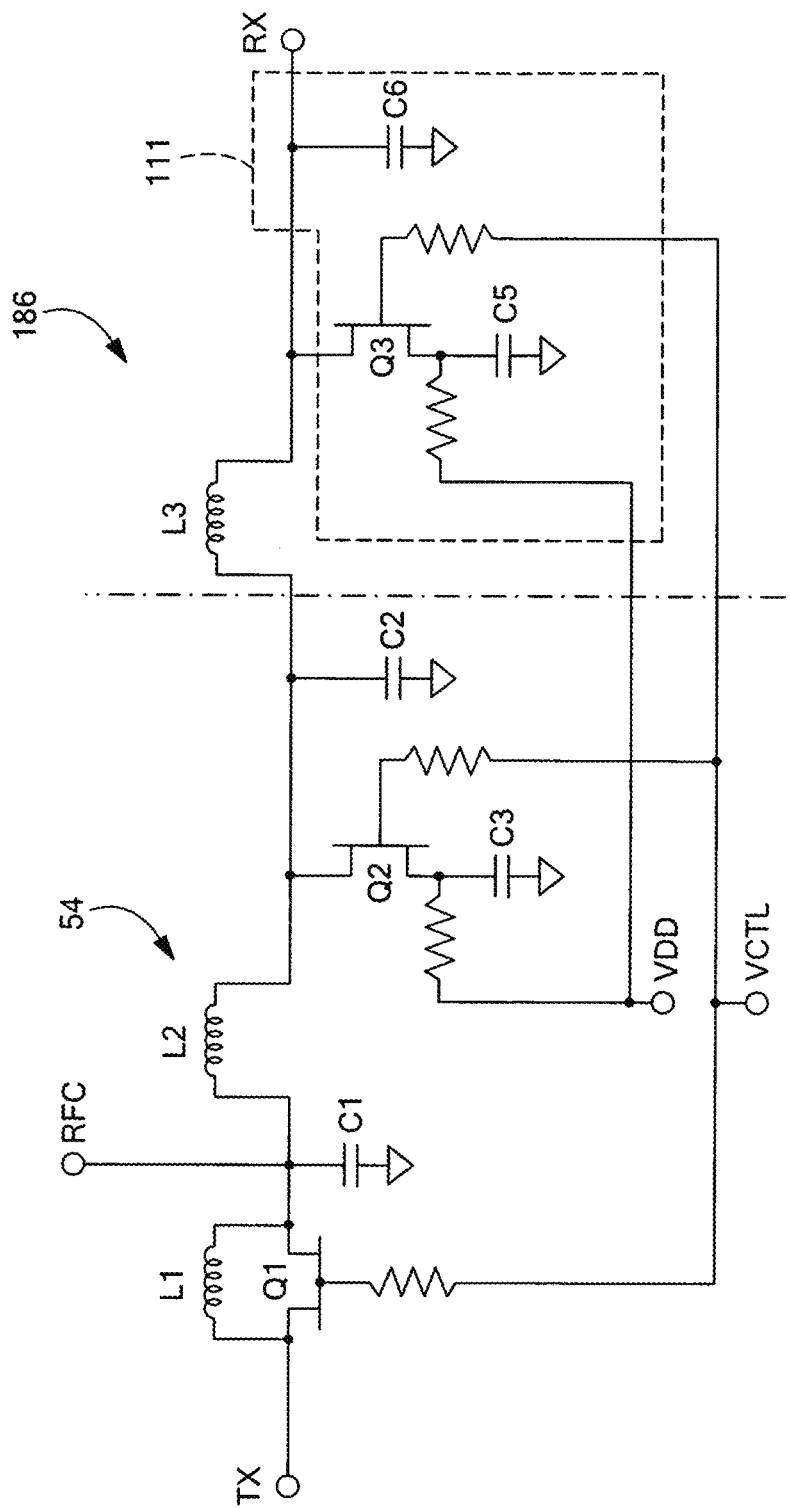
FIG. 10 is a schematic circuit diagram of one embodiment of the integrated switch module shown in FIG. 9.

Integrated switch module 30c includes switching die 54, e.g. as shown in FIG. 10 and discussed above with reference to FIG. 4. In this example, switching die 54 is connected to connection pads 105, 109, 142, 156 and 160. Integrated switch module 30c also preferably includes an additional switching die 186, e.g. including a shunt switch section 111 as shown in FIG. 10, which is connected to, inter alia, connection pad 168 on trace 154. Switching die 186 provides better RX port isolation for integrated switch module 30c. Inductors 180, 182, and 184 enhance the performance of switching dies 54, 186. Package 32 is preferably a custom lead-frame 5×5 mm QFN plastic package. FET devices can be used as the switching elements for switching dies 54 and 186, e.g. single FET devices or stacked FET devices for improved power handling capability of integrated switching module 30c. Preferably, switching module 30c matches all three radio frequency (RF) ports (RFC, RX and TX) to the desired system impedance.

Figure 11:
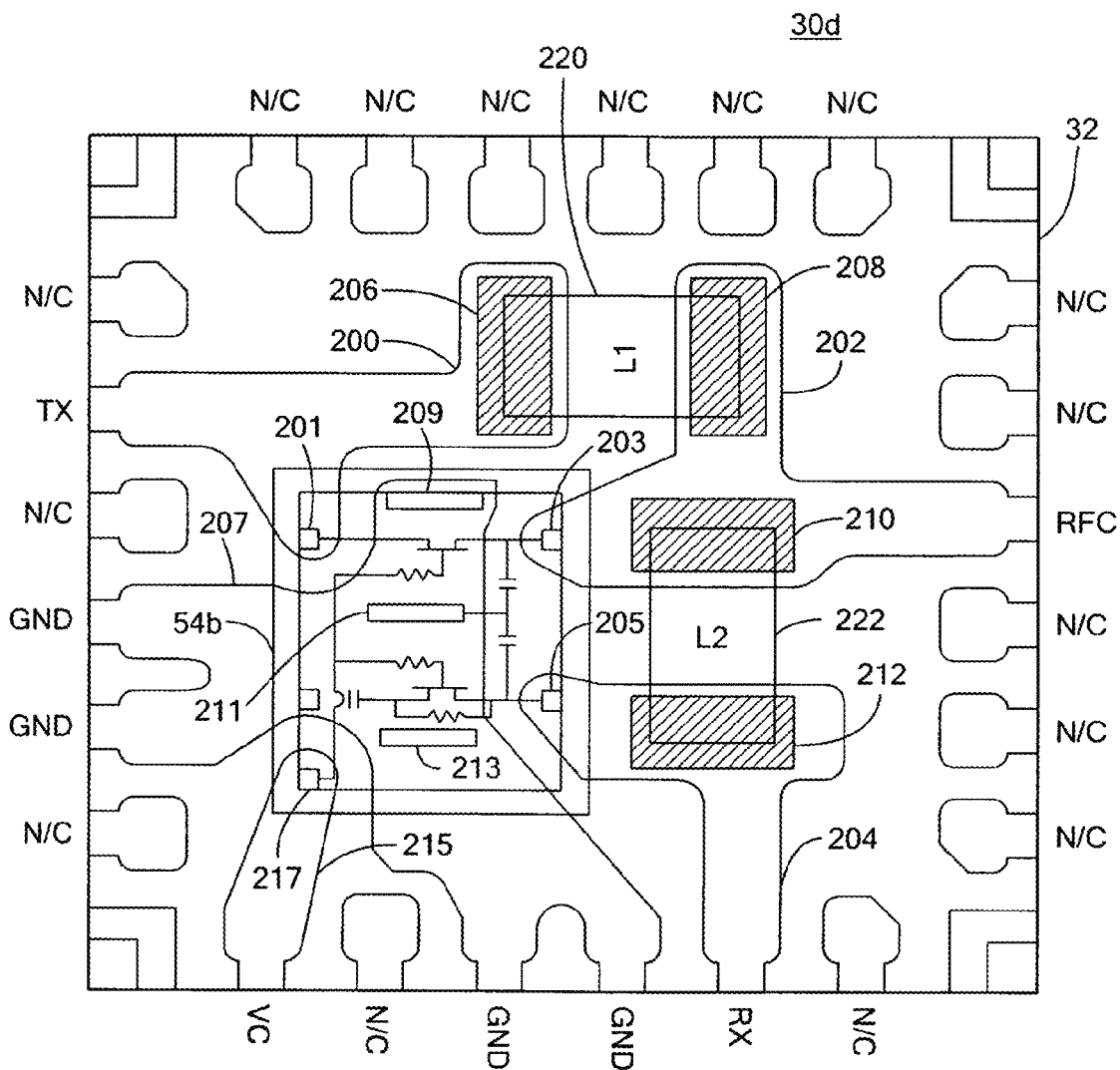
FIG. 11 is a package assembly diagram of yet another embodiment of the integrated switch module of this invention wherein the switching die is attached to the package in a flipped-chip configuration.

Integrated switching module 30d, FIG. 11, where like parts include like numbers includes package 32 which is customized to include traces 200, 202, and 204, 207, and 215. Trace 200 includes connection pad 201, landing pad 206 and input pin TX. Trace 202 includes connection pad 203, landing pads 208 and 210 and input pin RFC. Trace 204 includes connection pad 205, landing pad 212 and input pin RX. Trace 207 preferably includes connection pads 209, 211, and 213 to provide grounding for the switching die. Trace 215 includes connection pad 217 for the control pin VC.

Integrated switch module 30d also includes switching die 54b, e.g. a SPDT switching die as discussed above with reference to FIG. 4, or similar type switching die. However, in this design switching die 54b is attached in a flipped-chip configuration and includes connection posts, e.g. solder bumps, which are connected to, inter alia, connection pad 201 on trace 200, connection pad 203 on trace 202, connection pad 205 on trace 204, connection pads 209, 211, and 213 on trace 207 and connection pad 217 on trace 215. Such a flipped-chip configuration reduces parasitic interconnection inductance. Similar as discussed above, package 32 includes devices which enhance the performance of switching die 54b, e.g., inductor 220 (L1), which is preferably connected between landing pads 206 and 208 on traces 200 and 202. Similarly, inductor 222 (L2) is preferably connected between landing pads 210 and 212 on traces 202 and 204. Preferably, package 32 is a 4×4 mm QFN package. Switching die 54b is similar to the switching die 54, FIGS. 3 and 4, but is preferably aimed for higher frequencies due to reduced parasitic inductances between the switching die 54b and the traces 200, 202 and 204. The switching elements for switching die 54b can be single FET devices or they may be stacked FET devices for improved power handling capability of switching die 54b. Integrated switching module 30d also preferably matches all three radio frequency (RF) ports (RFIN, RFC and TX) to the desired system impedance.

Figure 12:
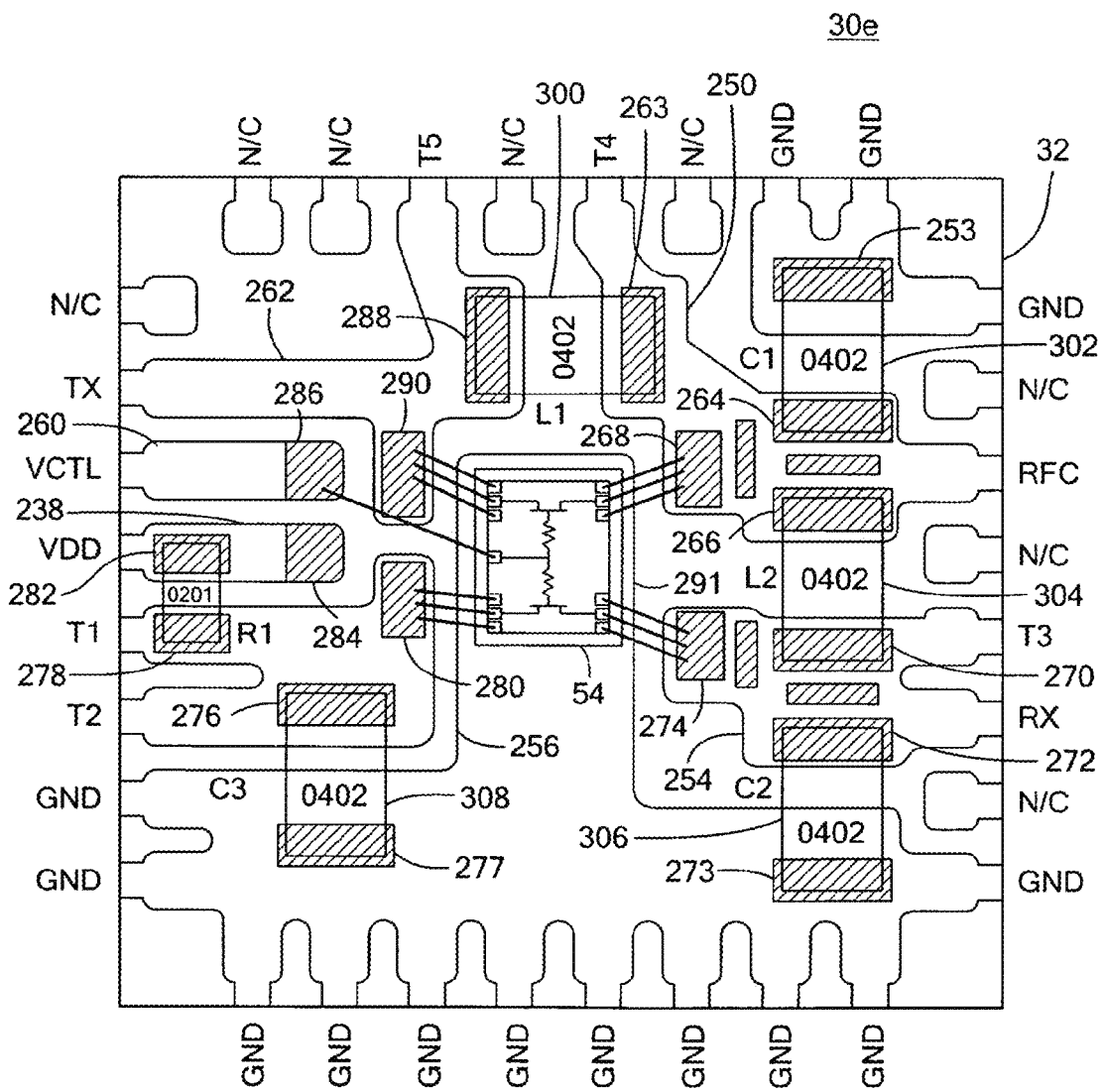
FIG. 12 is a package assembly diagram of yet another embodiment of the integrated switch module of this invention.

Integrated switch module 30e, FIG. 12, preferably integrates radio frequency switching elements and additional performance enhancing components in a single package and may be used to build a high power SPDT switch, e.g., as discussed above with reference to FIGS. 3 and 4. Preferably, module 30e, FIG. 12, includes all required external performance enhancing devices, e.g., inductors, capacitors, and resistors, and the like, which are integrated together with the switching semiconductor die in a leadless package.

In this example, integrated switch module 30e, where like parts have been given like numbers, includes package 32 which is customized to include traces 250, 252, 254, 256, 258, 260 and 262. Trace 250 preferably includes landing pads 263, 264, and 266, connection pad 268, and input pins T4 and RFC. Trace 252 preferably includes landing pad 253 and input pins GND. Trace 254 preferably includes landing pads 270 and 272, connection pad 274 and input pins T3 and RX. Trace 256 preferably includes landing pads 276 and 278, connection pad 280, and input pins T1 and T2. Trace 258 preferably includes landing pad 282, connection pad 284, and input pin VDD. Trace 260 preferably includes connection pad 286 and input pin VCTL. Trace 262 preferably includes landing pad 288, connection pad 290, and input pin TX and T5. Trace 291 is customized to receive and secure switching die 54. Pins T1-T5 preferably maintain the mechanical integrity of the lead-frame 32 and have no electrical significance.

Integrated switch module 30e includes switching die 54, e.g. a SPDT switch as discussed above with reference to FIG. 1. In this example, switching die 54 is connected to connection pads 268, 274, 280, 286, and 290 on traces 250, 254, 256, 260, 262, respectively.

Integrated switch module 30e also preferably includes performance enhancing devices, e.g., inductor 300 (L1), capacitor 302 (C1), inductor 304 (L2), capacitor 306 (C2), capacitor 308 (C3), and one or more resistors, such as resister 310 (R1). In this example, inductor 300 (L1) is connected between landing pad 263 and landing pad 288. Capacitor 302 (C1) is preferably connected between landing pad 253 and landing pad 264. Inductor 304 (L2) is preferably connected between landing pad 266 and landing pad 270. Capacitor 306 (C2) is preferably connected between landing pad 272 and landing pad 273. Capacitor 308 (C3) is preferably connected between landing pad 276 and landing pad 277. Resistor 310 (R1) is preferably connected between landing pads 278 and 282. Resistors R2 and R3, FIG. 4, are preferably on switching die 54, FIG. 12 (not shown).

Inductors 300, 304, capacitors 302, 306, and 308, resister 310 and the resistors on die 54 preferably enhance the performance of switching die 54. Package 32 is preferably a custom lead-frame 5×5 mm QFN plastic package. Field effect transistor (FET) devices can be used for the switching elements and are preferably on switching die 54. Inductors 300, 304, and capacitors 302, 306, and 308 are commercially available chip components, e.g., available from American Technical Ceramics (Huntington Station, N.Y. 11746). Switching die 54, inductors 300, 304, and capacitors 302, 306, and 308 may be used to quickly implement high power SPDT switches at different frequencies. This significantly reduces the product release time. The switching elements can be single FET devices or they can be stacked FET devices for improved power handling capability of the switch. Thus, module 30e may provide an SPDT switch, preferably in a 5×5 mm package, with all three radio frequency (RF) ports, RFC, TX, and RX matched to the desired system impedance.

Figure 13A:
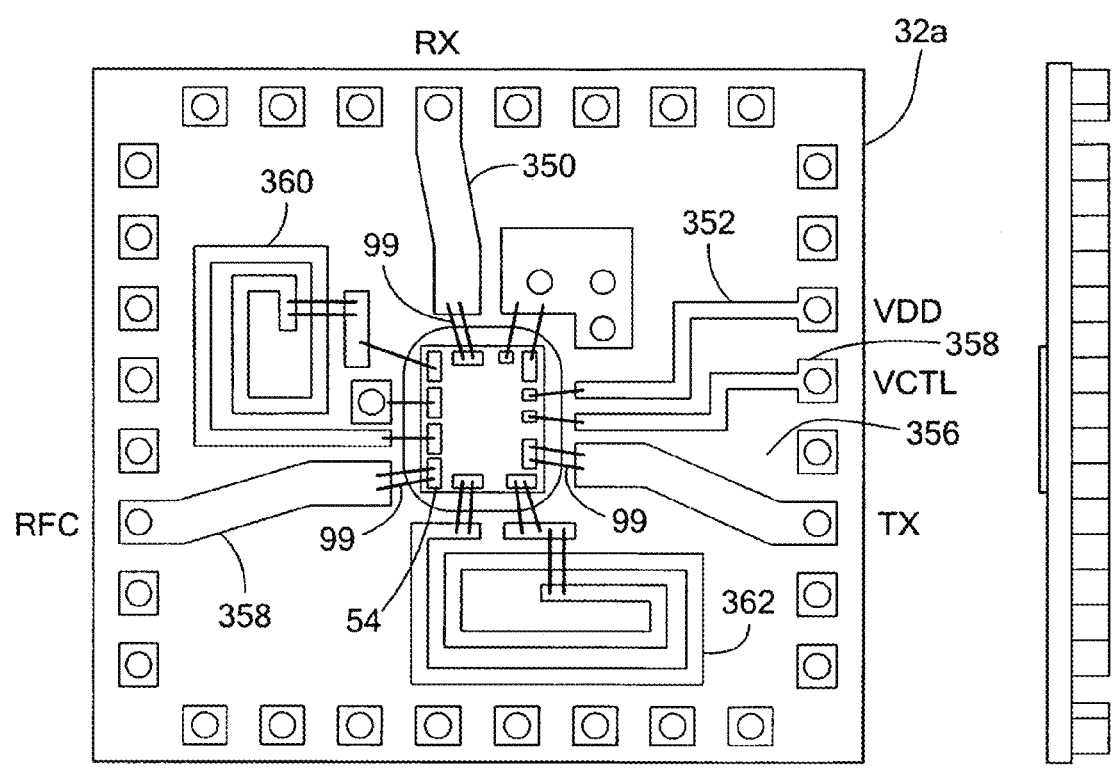
FIG. 13A is a package assembly diagram of yet another embodiment of the integrated switch module of this invention wherein traces on a laminated printed circuit board (PCB) are used to form one or more devices which enhance the performance of the switching die.

Integrated switching module 30f, FIG. 13A, preferably includes package base assembly 32a which is customized to include switching die 54, e.g., similar to the die for the single-pole-double-throw (SPDT) switch discussed above with reference to FIGS. 3 and 4, although various other types of switching dies may be used. Package base assembly 32a also preferably includes traces 350, 352, 354, 356, and 358 that connect to switching die 54. Package base assembly 32a also includes at least one trace configured to form a device which enhances the performance of switching die 54. In this example, traces 360 and 362 are configured to form inductors 360 and 362, respectively. In other examples, integrated switching module 30f may include traces which form other devices which enhance the performance of switching die 54d, e.g. capacitors, and the like.

Figure 13B:
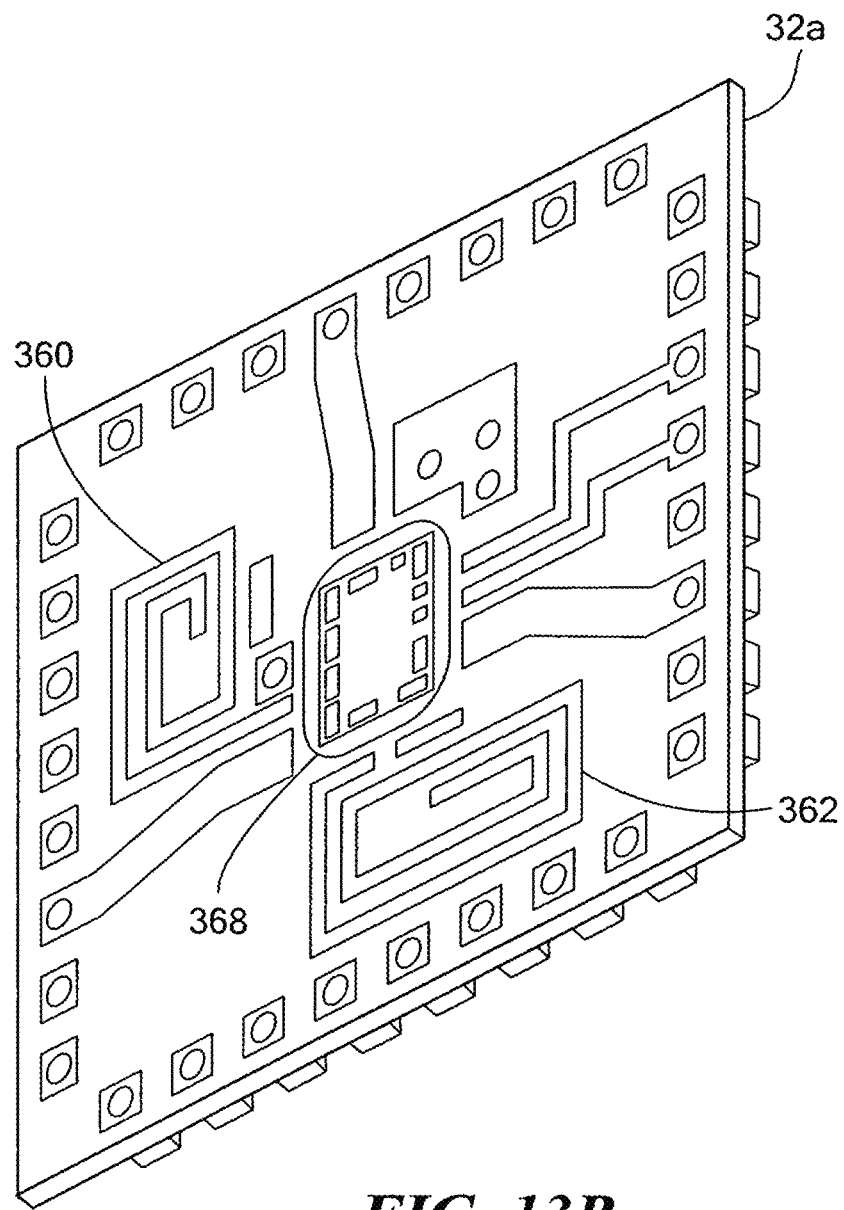
FIG. 13B is a three-dimensional view showing in further detail the opening for receiving the switching die shown in FIG. 13A.

FIG. 13B shows a three dimensional view of package base assembly 32e with traces 360 and 362 which form inductors 360, 362 and opening 368 configured to receive switching die 54. Preferably package base assembly 32a is part of a 5×5 mm leadless plastic over-molded or air-cavity package. Hybrid packaging may be used to integrate the needed devices or components which may enhance the operation of switching die 54. For example, a laminate substrate may be used and inductors 360 and 362 may be etched on the substrate. The substrate is preferably cut out to let the switching die 54 sit directly on the copper paddle of package base assembly 32a. The top surface of switching die 54 and the top surface of the substrate are preferably at the same level. This minimizes the length of the bond wires 99, FIG. 13A, between the switching die 54 and traces on the substrate. Hence, integrated switching module 30f can operate at higher frequencies because of the lower bond wire inductances. Because the connections between different performance enhancing devices or components may be made with shorter bond wires 99 inside the package, unwanted parasitic inductance or capacitance resulting from interconnections may be reduced. The reduction of unwanted parasitic may increase the operating frequency and/or bandwidth of high-power integrated switch module 30e. Hence, higher frequencies can be covered when compared to a similar product where the switching element and the additional components are laid out separately on the PCB board. Because switching die 54 is sitting directly on the copper paddle, the thermal resistance may be improved and switching die 54 may operate at higher input power levels. Similar as discussed above, FET devices can be used for the switching elements for switching die 54 and capacitors can be integrated in the switching die 54. The switching elements can be single FET devices or they can be stacked FET devices for improved power handling capability of switch die 54. Preferably, integrated switching module 30f matches all three radio frequency (RF) ports, RFC, TX, and RX to the desired system impedance.

Figure 14:
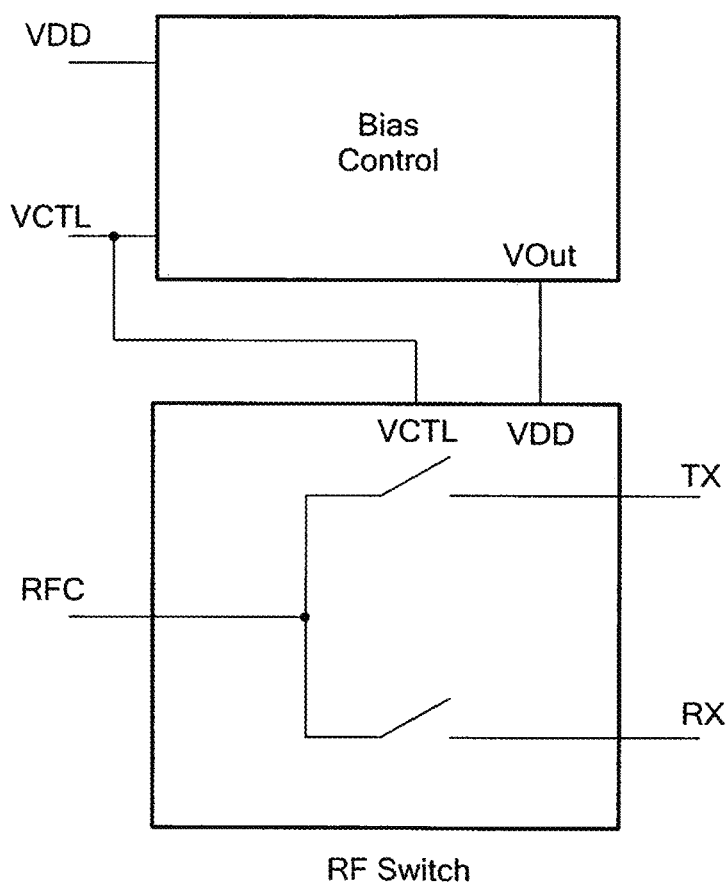
FIG. 14 is a schematic block diagram of one embodiment of a bias control circuit which may be used to enhance the performance of the integrated switch module shown in FIGS. 3-13B.

The performance of the various embodiments of integrated switch module 30 discussed above with reference to FIGS. 3-13B may be further improved by forward biasing the FET channels when the FETs are in the ON state. By forward biasing, the FET channel is further opened and insertion loss of the switching die(s) is reduced. This may improve the long term reliability of the switching die as the junction of the FET devices is kept at a lower temperature. The forward biasing also guarantees that the FET channel will remain in its fully "ON" state in the event of voltage build-up at the drain and source due to substrate charge injection effects. Bias control circuitry, e.g., bias control circuitry 370 as shown in FIG. 14 may be integrated in the customized package 32 discussed above, with reference to FIGS. 3-12B or the bias control circuit may be external to the package and can be used to apply lower Vdd when the switch is ON and higher Vdd when the switch is OFF to get the forward biasing without affecting the power handling of the switch in the OFF state.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:
1. An integrated switch module comprising:
a package configured to include at least one trace, the trace including one or more of at least one connection pad and at least one landing pad;
at least one switching die connected to the at least one connection pad, the at least one switching die comprising one or more switching devices having a high loss isolation state and a low loss through state, the one or more switching devices configured to provide switching for radio frequency (RF) signals; and at least one device connected to the at least one landing pad within the package, the at least one device configured to enhance the frequency response characteristics of the switching die.

2. The integrated switch module of claim 1 further including a plurality of traces each including one or more connection pads and one or more landing pads.

3. The integrated switch module of claim 2 in which the at least one device is connected between two landing pads.

4. The integrated switch module of claim 1 in which the at least one device includes an inductor.

5. The integrated switch module of claim 1 in which the at least one device includes a capacitor.

6. The integrated switch module of claim 1 in which the at least one device includes a resistor.

7. The integrated switch module of claim 1 in which the at least one device includes a low noise amplifier.

8. The integrated switch module of claim 1 in which the at least one device includes an additional switching die.

9. The integrated switch module of claim 1 in which the at least one device includes a bias control circuit.

10. The integrated switch module of claim 1 in which the switching die includes a switching semiconductor die.

11. The integrated switch module of claim 1 in which the switching die includes a high power semiconductor switching die with a predetermined number of poles and a predetermined number of throws.

12. The integrated switch module of claim 1 in which the switching die includes a high power semiconductor single pole-double-throw switching die.

13. The integrated switch module of claim 1 in which the switching die includes a high power semiconductor single pole-four-throw switching die.

14. The integrated switch module of claim 1 in which the at least one switching die includes a plurality of switching dies.

15. The integrated switch module of claim 1 in which the switching die includes one or more FET switches.

16. The integrated switch module of claim 14 in which said one or more FET switches are connected in series.

17. The integrated switch module of claim 1 further including one or more traces configured to reduce the length of bond wires connecting to the switching die.

18. The integrated switch module of claim 1 includes one or more capacitors and/or one or more inductors that are configured to tune the frequency response of the switch module.

19. The integrated switch module of claim 1 in which the at least one trace, the at least one landing pad, the at least one connection pad, the at least one switching die, and the at least one device are formed on the package.

20. The integrated switch module of claim 1 in which the package includes a lead frame package.

21. The integrated switch module of claim 20 in which the lead frame package is a quad flat no leads (QFN) package.

22. The integrated switch module of claim 1 in which the at least one device includes a plurality of devices.

23. The integrated switch module of claim 22 in which the plurality of devices include one or more of: a capacitor, an inductor and/or a resistor.

24. The integrated switch module of claim 1 in which said at least one device is configured to enhance said performance by increasing the operating frequency of the switching die to enable high-power low insertion loss over a narrow bandwidth.

25. The integrated switch module of claim 1 in which said at least one device is configured to enhance said performance by providing a fail-safe operation of said switching die.

26. The integrated switch module of claim 1 in which the at least one switching die includes a bias control circuit.

27. The integrated switch module of claim 1 in which the at least one switching die is connected to the at least one trace in a flipped-chip configuration.

28. An integrated switch module comprising:
a package configured to include:
at least one trace, the trace including one or more of at least one connection pad and at least one landing pad;
at least one switching die connected to the at least one connection pad, the at least one switching die comprising one or more switching devices having a high loss isolation state and a low loss through state, the one or more switching devices configured to provide switching for radio frequency (RF) signals; and
at least one device connected to the at least one landing pad within the package, the one device configured to enhance the frequency response characteristics of the switching die.

29. An integrated switch module comprising:
a package configured to include:
at least one switching die, the at least one switching die comprising one or more switching dies having a high loss isolation state and a low loss through state, the one or more switching devices configured to provide switching for radio frequency (RF) signals;
at least one connection trace including at least one connection pad configured to connect to the switching die,
at least one device trace configured to form at least one device, the at least one device disposed within the package and configured to enhance the frequency response characteristics of the at least one switching die.

30. The integrated switch module of claim 29 in which the at least one device includes an inductor.

31. The integrated switch module of claim 29 in which the at least one device includes a capacitor.

32. The integrated switch module of claim 29 in which the at least one device includes a resistor.

33. The integrated switch module of claim 29 in which the at least one device includes a low noise amplifier.

34. The integrated switch module of claim 29 in which the at least one device includes an additional switching die.

35. The integrated switch module of claim 29 in which the at least one device includes a bias control circuit.

36. The integrated switch module of claim 29 in which the switching die includes a switching semiconductor die.

37. The integrated switch module of claim 29 in which the switching die includes a high power semiconductor switching die with a predetermined number of poles and a predetermined number of throws.

38. The integrated switch module of claim 29 in which the switching die includes a high power semiconductor single pole-double-throw switching die.

39. The integrated switch module of claim 29 in which the switching die includes a high power semiconductor single pole-four-throw switching die.

40. The integrated switch module of claim 29 in which the at least one switching die includes a plurality of switching dies.

41. The integrated switch module of claim 29 further including one or more traces configured to reduce the length of bond wires connecting to the switching die.

42. The integrated switch module of claim 29 in which the at least one device trace includes a plurality of device traces configured to form a plurality of devices configured to enhance the performance of the at least one switching die.

43. The integrated switch module of claim 29 in which the package includes a lead frame package.

44. The integrated switch module of claim 43 in which the lead frame package is a quad flat no leads (QFN) package.

45. The integrated switch module of claim 29 includes one or more capacitors and/or one or more inductors that are configured to tune the frequency response of the switch module.

46. The integrated switch module of claim 29 in which said at least one device is configured to enhance said performance by increasing the operating frequency of the switching die to enable high-power low insertion loss over a narrow bandwidth with failsafe operation.

47. The integrated switch module of claim 29 in which said at least one device is configured to enhance said performance by providing a fail-safe operation of said switching die.

48. The integrated switch module of claim 29 in which the at least one switching die includes a bias control circuit.

49. The integrated switch module of claim 4, wherein the inductor is electrically connected in parallel with a channel of a field effect transistor of the at least one switching die to enhance the frequency performance of the field effect transistor.

* * * * *